US006346733B1

(12) United States Patent
Lee et al.

(10) Patent No.: US 6,346,733 B1
(45) Date of Patent: Feb. 12, 2002

(54) NONVOLATILE MEMORY DEVICE

(75) Inventors: Woon-Kyung Lee; Youn-Ho Lee; Eui-Do Kim, all of Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/345,581

(22) Filed: Jun. 30, 1999

(30) Foreign Application Priority Data

Jul. 3, 1998 (KR) ............................................. 98-26771

(51) Int. Cl.[7] .......................... H01L 29/76; H01L 29/94
(52) U.S. Cl. ..................... 257/390; 438/275; 438/926
(58) Field of Search ......................... 257/208, 390–393; 438/275–278, 926

(56) References Cited

U.S. PATENT DOCUMENTS

| | | | | |
|---|---|---|---|---|
| 4,223,394 A | * | 9/1980 | Pathak et al. | 365/210 |
| 4,371,956 A | * | 2/1983 | Maeda et al. | 365/185 |
| 4,760,290 A | * | 7/1988 | Martinez | 307/465 |
| 5,580,810 A | * | 12/1996 | Katto et al. | |
| 5,650,656 A | * | 7/1997 | Iwahashi | 365/391 |
| 5,753,953 A | * | 5/1998 | Fukumoto | 257/316 |
| 5,899,706 A | * | 5/1999 | Kluwe et al. | 438/129 |
| 6,020,616 A | * | 2/2000 | Bothra et al. | 257/381 |
| 6,040,605 A | * | 3/2000 | Sano et al. | 257/369 |

* cited by examiner

*Primary Examiner*—Richard Booth
(74) *Attorney, Agent, or Firm*—Marger Johnson & McClollom, P.C.

(57) ABSTRACT

A nonvolatile memory device is provided in which cell uniformity is significantly improved. The device includes a plurality of burial $N^+$ diffusion layers extending over the surface of a semiconductor substrate. The plurality of burial $N^+$ diffusion layers are the source/drains of cell transistors and the sub bit-lines of the memory cell array. The device additionally includes a plurality of word lines formed over the semiconductor substrate with gate dielectrics interposed therebetween. The plurality of word lines extend perpendicularly to the burial $N^+$ diffusion layers. A plurality of select lines extend parallel to the word lines and selectively transfer external electrical signals via main bit-lines to the sub bit-lines. The main bit-lines extend parallel to said sub bit-lines. Finally, dummy lines extend parallel to the word lines in the spaces between the select lines and the adjacent word lines.

12 Claims, 7 Drawing Sheets

NONVOLATILE MEMORY DEVICE

BACKGROUND OF THE INVENTION

1. Field of the Invention

The present invention relates to a nonvolatile memory device and, more particularly, to a flat-cell mask ROM that prevents the deterioration of cell uniformity attributed to the spacing between word and select lines.

2. Description of the Related Art

Semiconductor memory devices are primarily divided into random access memories (RAMs) and read only memories (ROMs). RAMs lose data over time while ROMs do not. Examples of RAM devices include Dynamic Random Access Memory (DRAM) and Static Random Access Memory (SRAM). Examples of ROM devices include mask ROMs.

Mask ROMs have characteristic cell structures primarily classified into NOR and NAND types. Preexisting NOR-type cells are easy to operate at high speeds by virtue of their high cell currents. NOR-type cells, however, have a significant disadvantage in that they have a large cell area. In contrast, NAND-type cells have low cell current and have a small cell area, thus, they improve semiconductor integration. Accordingly, NAND-type cell structures are preferred over NOR-type cells.

NOR-type flat-cells can be made to have small cell areas like NAND-type cells while keeping the advantages of the NOR-type cells. As is well known, the NOR-type flat-cells are free of the field oxide used for element isolation in the cell array. NOR-type flat-cells use high cell currents and have improved cell uniformity over NAND-type cells so that they can be operated at high speeds with low voltages. In addition, NOR-type flat-cells make it easy to develop multi-bit cells (MBC) or multi-level cells (MLC) for storing a plurality of information in a single cell.

FIGS. 1 and 2 refer to a NOR-type flat-cell mask ROM. FIG. 1 is a schematic plan view showing the NOR-type flat-cell mask ROM disclosed in Korean Patent Application No. 97-20507 and FIG. 2 is an equivalent circuit diagram of the cells shown in FIG. 1. The NOR-type flat-cells have a cell structure that lowers the channel resistance in a read-out path and reduces the number of select lines.

As shown in FIGS. 1 and 2, the NOR-type flat-cell mask ROM has a matrix structure in which a plurality of burial $N^+$ diffusion layers 12 extend in the column direction. The plurality of burial $N^+$ diffusion layers 12 form the source/drains and the sub bit-lines of the cell transistors on the surface of the semiconductor device. A plurality of word lines W/L1–W/Ln is laid overlapping with and extending perpendicularly to the burial $N^+$ diffusion layers. Each word line W/L1–W/Ln is the gate electrode of a cell transistor. A plurality of metal lines B/L1, B/L2, . . . is arranged parallel to the burial $N^+$ diffusion layers 12. The metal lines B/L1, B/L2, . . . are alternatively arranged as main bit-lines and ground lines.

In order to operate the cells of the NOR-type flat-cell mask ROM, a predetermined voltage level between 0–3.3V is applied to selected bit lines. Additionally, zero volts is applied to adjacent ground lines. Depending on the combination of the select lines S/L1, S/L2, S/L3, S/L4, a first, a second, a third, and a fourth column are correspondingly selected. In the equivalent circuit diagram of FIG. 2, for instance, if a memory cell array of the first column is selected, a predetermined voltage is applied to the first bit line B/L1 while zero volts are applied to the second bit line B/L2. At this time, the first and the third select lines S/L1 and S/L3 are in a high voltage state and the second and the fourth select lines S/L2 and S/L4 are in a low voltage state. As a result, the column selection enters a read state in which the word lines W/L1, W/L2, . . . W/Ln−1, W/Ln of the memory cell array in the first column are ready to be read. For raw selection, applying a high voltage to the selected word lines and zero voltage to the non-selected word lines begins the read operation.

Where the threshold voltage Vth of the cell transistors is lower than the voltage of the selected word lines, the selected cells are turned-on and the discharge path from the bit lines to the ground lines is detected, thereby reading the cells as being "ON". On the other hand, where the threshold voltage Vth of the cell transistors is higher than the voltage of the selected word lines, the selected cells are turned-off to maintain the voltage of the bit lines, thereby reading the cells as being "OFF".

The NOR-type flat-cell mask ROM requires that the word lines and select lines in the memory cell array should be spaced a predetermined distance. This is a minimal necessary condition to achieve stability in the electrical connection from the main bit-lines through the select lines to the sub bit-lines (burial $N^+$ diffusion layers 12) of the memory cell array. That is, a predetermined space between a word line and a select line is needed to prevent violation of the element isolation and minimum design rules. The spacing between word line and select line, however, is a negative factor against cell uniformity and design rule reduction. For example, the first word line W/L1 and the nth word line W/Ln, each lying adjacent to a select line at a predetermined distance, show a different critical dimension CD as compared with the word lines repeated within the memory cell array. This situation can be explained by the so-called loading effect. The loading effect is caused by a number of processes including the photograph and dry etching processes used for patterning word lines.

In the photograph process for forming the patterns repeated under a minimum design-rule, over-exposing is carried out with the aim of avoiding the problems derived from resolution limit. In this case, the loose patterns, which are free from the minimum design-rule, however, show a large skew deviation of the dimension CD. In particular, where the exposure process is carried out on the basis of the space among the repeated word lines W/L2, . . . , W/Ln−1, the first and the nth word lines W/L1 and W/Ln are exposed at a greater energy than the standard energy because the space between the second select line S/L2 and the first word line W/L1 or between the third select line S/L3 and the nth word line W/Ln is large. Accordingly, the first and nth word lines W/L1, W/Ln come to have different dimensions CD than the repeated word lines W/L2, . . . , W/Ln−1. This variation in dimension CD appears in the dry etch process as well. When a dry etch process is executed in a pattern-dense area and a pattern-sparse area, the evaporation pressure caused by the reaction between the etchant in a plasma state and the area to be etched is significantly reduced in the pattern-dense area, resulting in deterioration of etch uniformity. Accordingly, the skew deviation of dimension CD becomes large at the first and nth word lines W/L1 and W/Ln.

A fabricating method for NOR-type flat-cells comprises forming a burial $N^+$ diffusion layer which is provided as a sub bit-line on a $P^-$ substrate surface within a memory cell array, forming a gate dielectric and a gate electrode (word line), implanting N–source/drain ions for a LDD (lightly doped drain) structure, forming a sidewall spacer, and implanting N+ source/drain ions into a peripheral circuit region. As select lines and word lines are spaced at predetermined distances, the junction boundary between the burial N+ diffusion layer and the P− substrate is clearly exposed. Thus, when a whole surface etch-back process is carried out to form the sidewall spacer, over-etching is made to the exposed surface, deteriorating the junction breakdown voltage.

In addition, during a programming process, impurities are implanted in a channel of a cell transistor to selectively shift threshold voltages. When programming is carried out after the formation of word lines, the spacing of the select lines from the word lines degrades the uniformity of threshold voltage. Moreover, where the programming process is applied as an after contact programming (ACP) process, when a planarization layer is formed by reflowing a BPSG film, it flows into the spacing between the select lines and the word lines, so that the BPSG film is thinner over the first and nth word lines W/L1 and W/Ln than over others. This results in degrading program uniformity when the programming process is carried out after planarization of the BPSG film.

SUMMARY OF THE INVENTION

Accordingly, an object of the present invention is to overcome the disadvantages associated with prior art, nonvolatile memory devices.

Another object of the present invention is to provide a nonvolatile memory device that prevents deterioration of cell uniformity attributable to the spacing between word and select lines.

A nonvolatile memory device is provided. The nonvolatile memory device includes a plurality of burial N+ diffusion layers formed over a semiconductor substrate, each burial N+ diffusion layer being a source/drain of a cell transistor and a sub bit-line of a memory cell array and a plurality of word lines formed over the semiconductor substrate with a plurality of gate dielectrics interposed therebetween, the plurality of word lines extending perpendicularly to the plurality of burial N+ diffusion layers. A plurality of select lines extending parallel to the word lines for selectively transferring external electrical signals via main bit-lines to the sub bit-lines, the main bit-lines extending parallel to the sub bit-lines. A plurality of dummy lines extending parallel to the plurality of word lines, each dummy line being formed between a selected word line and an adjacent select line.

The plurality of dummy lines receive a constant voltage when the cell transistor is in an operative state. The constant voltage is a ground voltage.

Adjacent dummy lines are separated by a dummy line pitch and adjacent word lines are separated by a word line pitch, the dummy line pitch being substantially equal to the word line pitch. Furthermore, the plurality of dummy lines is formed of a same material as the plurality of word lines. The selected word line and the adjacent select line are spaced apart between 0.1–1.5 µm.

A method for making a nonvolatile memory device on a semiconductor substrate is also provided. The method includes forming a plurality of N+ burial diffusion layers on the substrate and forming a plurality of word lines perpendicular to the plurality of N+ burial diffusion layers. The method further includes forming a plurality of select lines parallel to the plurality of word lines and forming a plurality of dummy lines parallel to the plurality of word lines, each dummy line arranged between a selected word line and an adjacent select line.

BRIEF DESCRIPTION OF THE DRAWINGS

The foregoing and other objects, features, and advantages of the present invention will become more readily apparent from the following detailed description when taken in conjunction with the accompanying drawings in which.

DETAILED DESCRIPTION OF THE PREFERRED EMBODIMENTS

Figure 1:
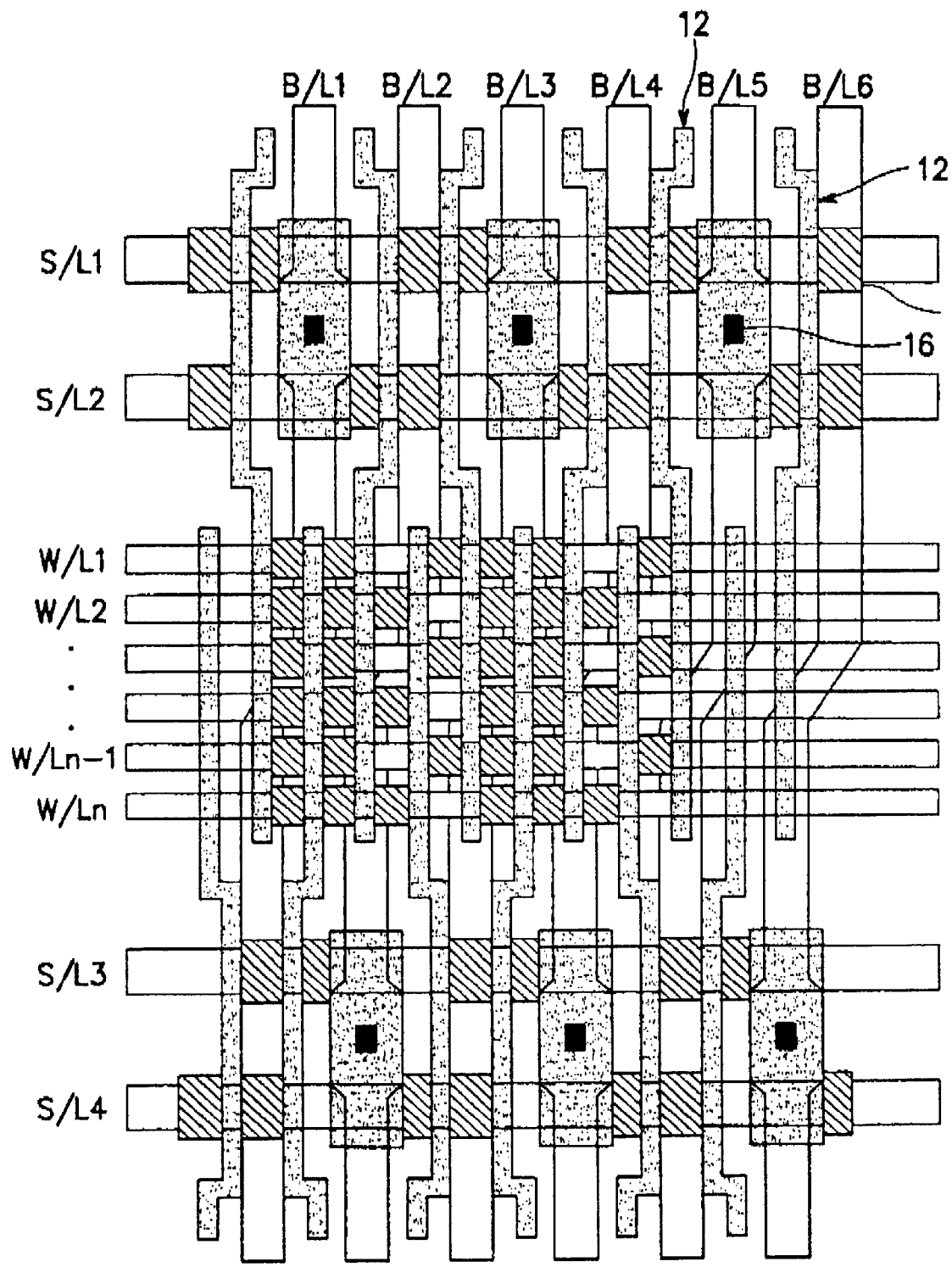
FIG. 1 is a plan view of a conventional NOR-type flat-cell mask ROM.
Figure 2:
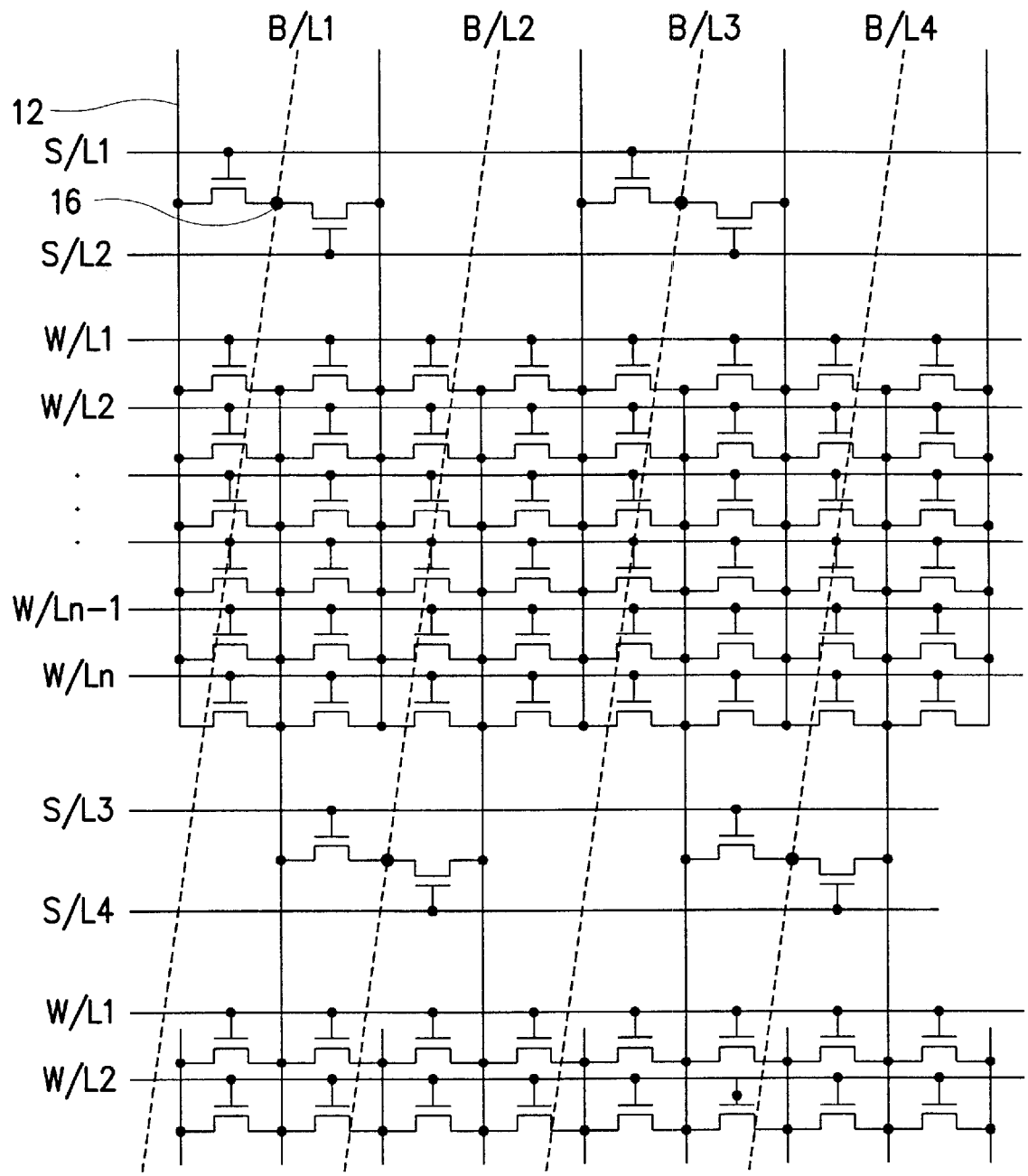
FIG. 2 is an equivalent circuit diagram of the cells shown in FIG. 1.
Figure 3:
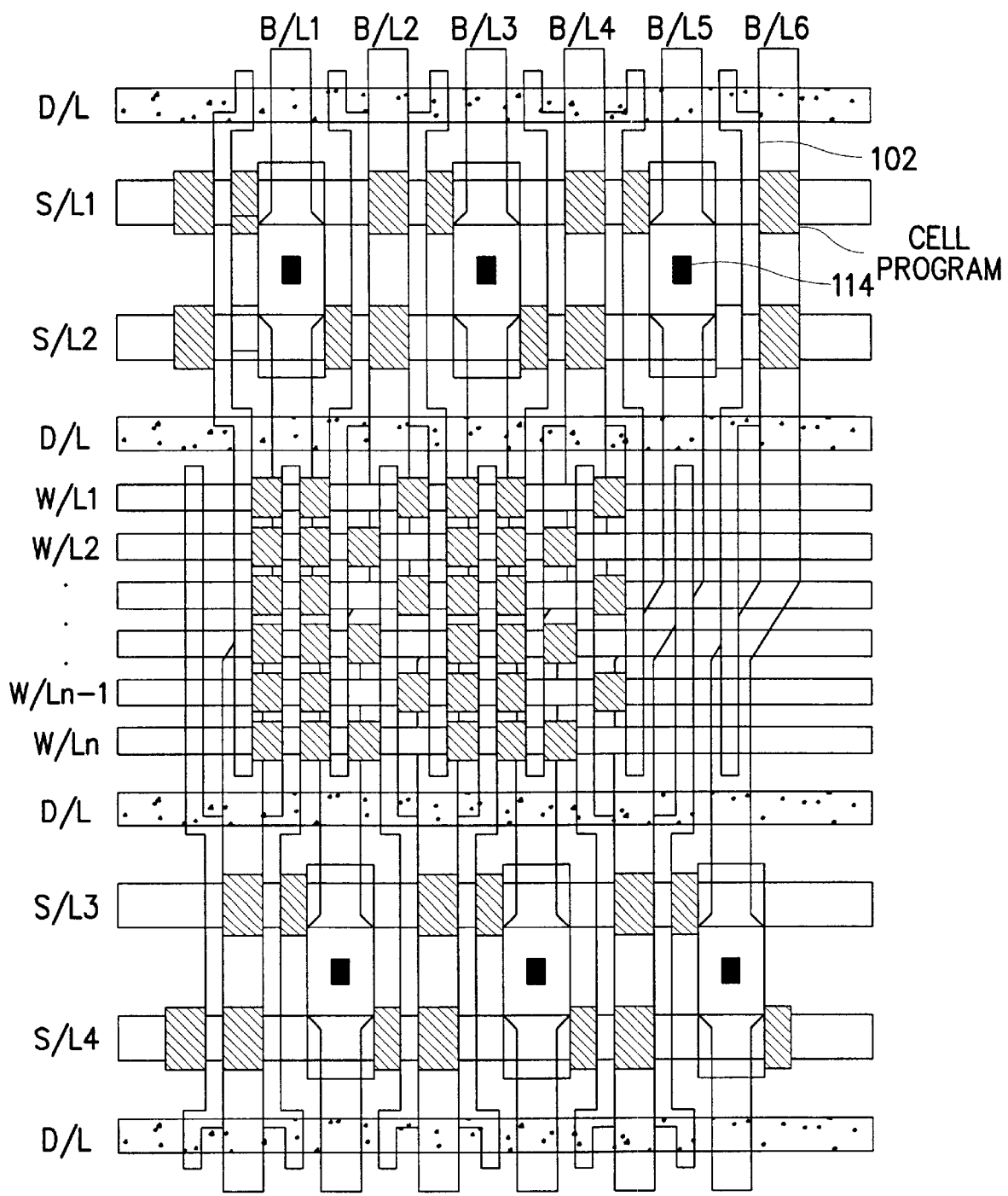
FIG. 3 is a plan view of a NOR-type flat-cell mask ROM according to the present invention.
Figure 4:
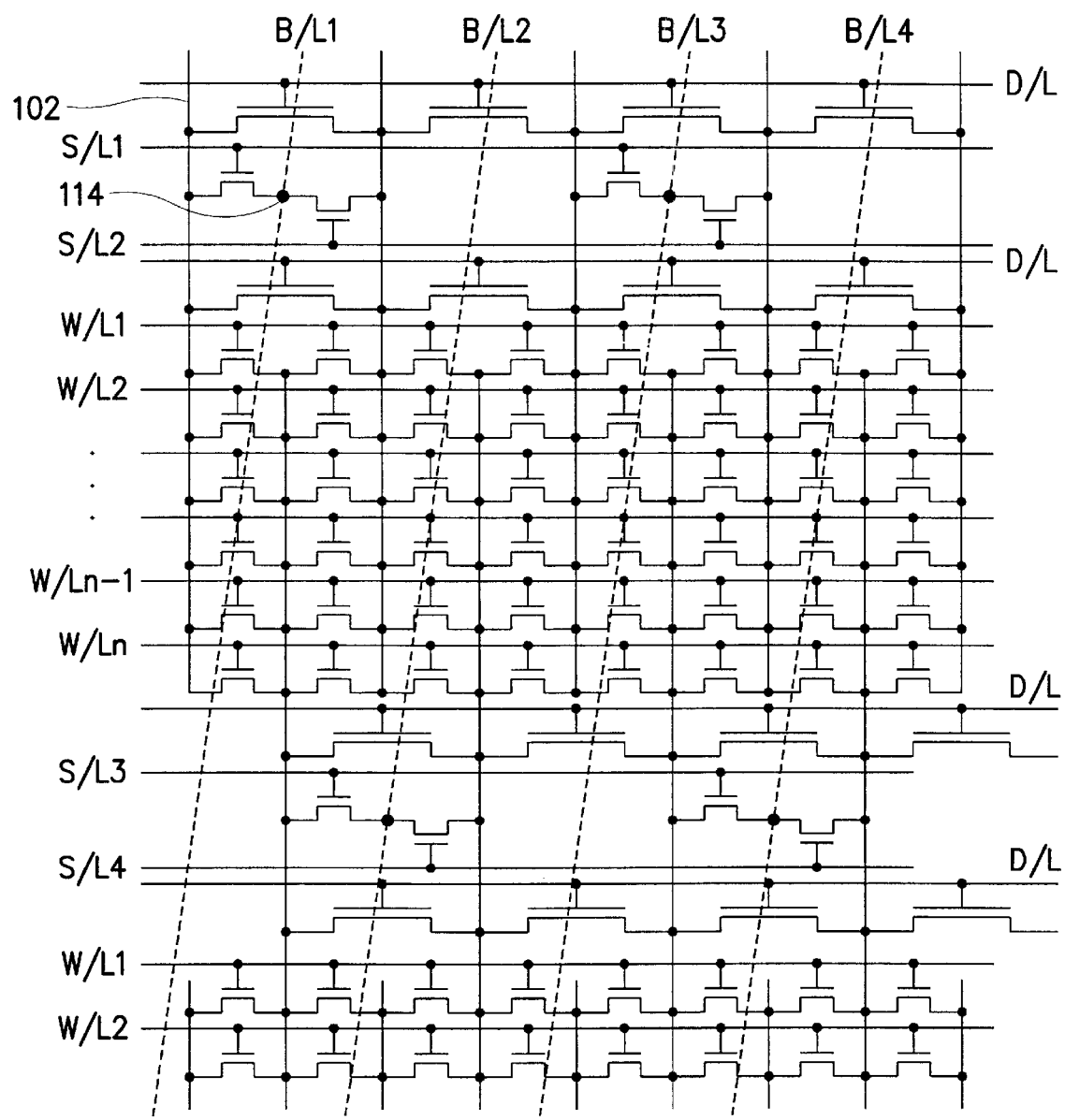
FIG. 4 is an equivalent circuit diagram of the cells shown in FIG. 3.

FIG. 3 is a plan view of the NOR-type flat cell mask ROM of the present invention and FIG. 4 is an equivalent circuit diagram of the cell.

As shown in FIGS. 3 and 4, the NOR-type flat-cell mask ROM of the present invention has a matrix structure in which a plurality of burial N+ diffusion layers 102 extend in the column direction. Each burial N+ diffusion layer 102 is the source/drain and sub bitline of a cell transistor on the surface of the semiconductor device. A plurality of word lines W/L1–W/Ln, is laid overlapping with and extending perpendicularly to the burial N+ diffusion layers 102. Each word line W/L1–W/Ln is the gate electrode of a cell transistor. A plurality of metal lines B/L1, B/L2, ..., each corresponding to the pitch of two sub bit-lines consisting of the burial N+ diffusion layers 102, are arranged parallel to the burial N+ diffusion layers 102. The metal lines are alternatively arranged as main bit-lines and ground lines.

In addition, according to the NOR-type flat-cell mask ROM of the present invention, select lines S/L1, S/L2, ... through which external electrical signals are transferred from the sub bit-lines to the main bit-lines, extend parallel to the word lines. The select lines are positioned at a predetermined distance, preferably 0.1–1.5 µm, from adjacent word lines. That is, the first word line W/L1 or the nth word line W/Ln are positioned at a predetermined distance, preferably 0.1–1.5 from adjacent select lines, e.g., select lines S/L2 and S/L3.

In the space between the select line and the adjacent word line is placed a dummy line D/L. The dummy line D/L is formed in the same manner as the word lines. These dummy lines are formed between the select lines and the word lines in the same manner as the repeat unit of the word lines without causing an increase in layout area. That is, the dummy lines are placed outside the first word line W/L1 and the nth word line W/Ln by the same pitch as the word lines W/L1–W/Ln. Preferably, the dummy lines D/L are formed at the same time as the word lines and applied with a constant voltage, e.g., ground voltage, when the cell transistor is operative. The dummy lines D/L, as shown in FIG. 4, overlap with the burial N+ diffusion layer 102 to give parasite transistors. Since ground voltage is applied to the dummy lines D/L and the dummy lines are the gate electrodes for these parasite transistors, the parasite transistors are sufficiently turned off. Hence, the NOR-type flat-cell mask ROM of the present invention can maintain cell operation like the conventional mask ROMs devoid of dummy lines D/L. In addition, the insertion of the dummy lines allows the first and the nth word lines W/L1 and W/Ln, respectively, to have the same adjacent pattern as the other repeat word lines W/L2, ..., W/Ln−1 thereby relieving the loading effect resulting from the uniformity of the dimension photograph and etch process for patterning the word lines. The structure described above, therefore, improves the uniformity of dimension CD of the word lines.

Figure 5:
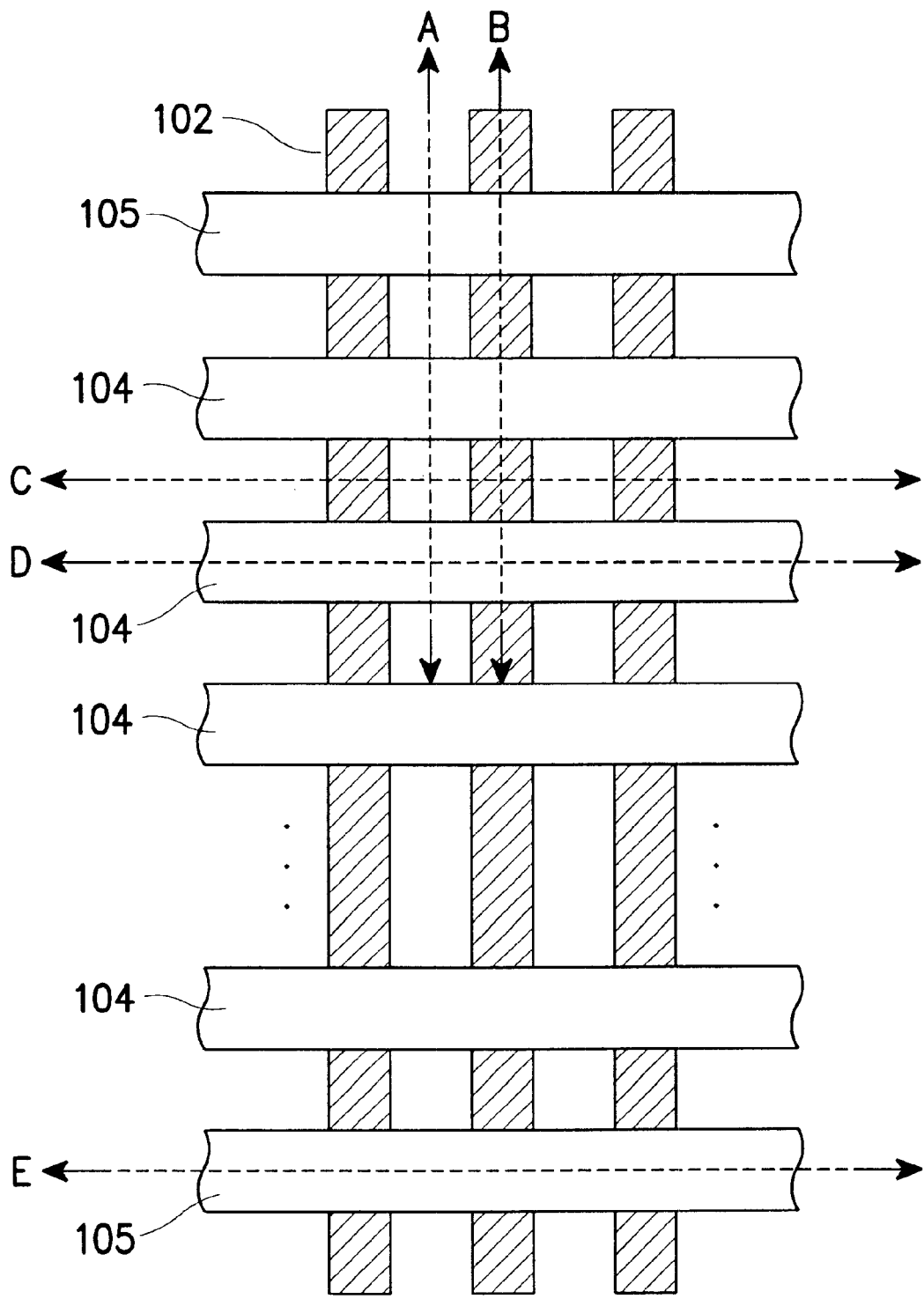
FIG. 5 is a schematic plan view of the structure of a unit cell in the mask ROM of FIG. 3.
Figure 6:
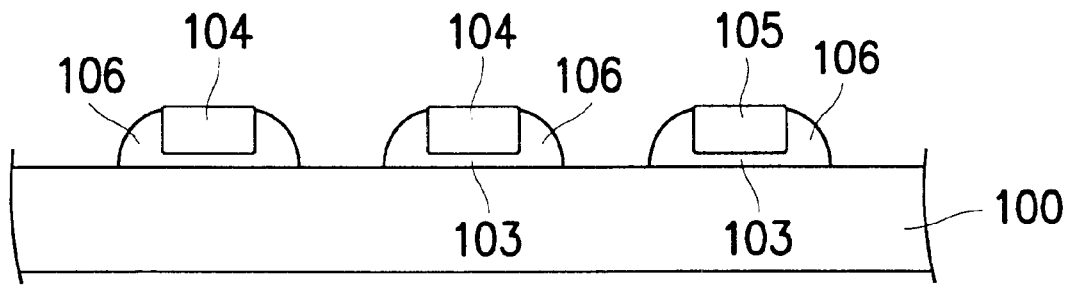
FIGS. 6 to 10 are cross sectional views of the unit cell of FIG. 5, taken along lines A, B, C, D, and E, respectively.
Figure 7:
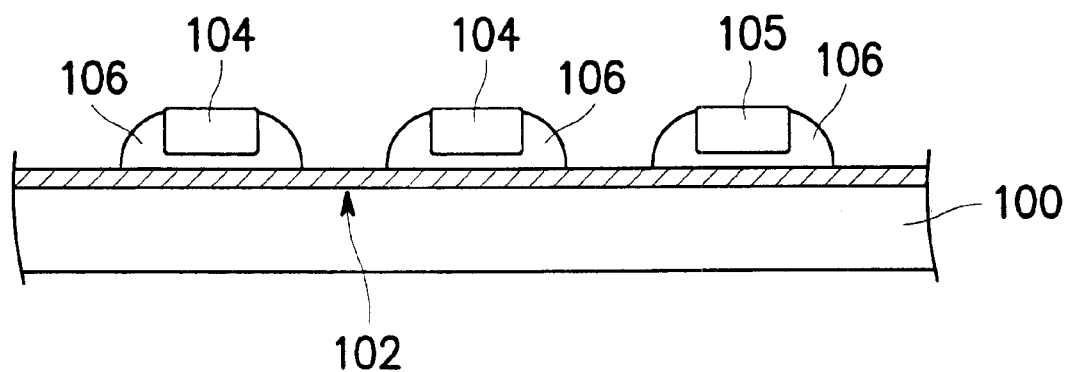
Figure 8:
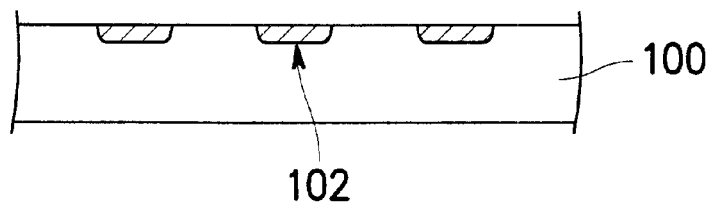
Figure 9:
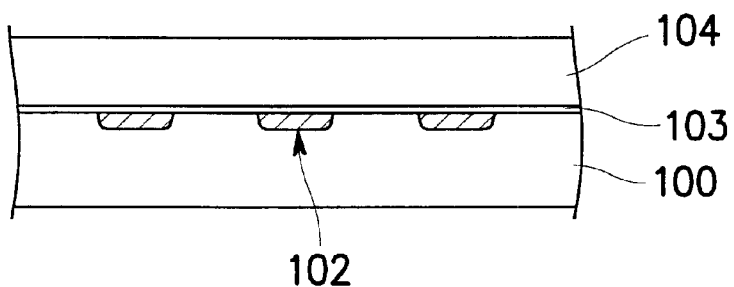
Figure 10:
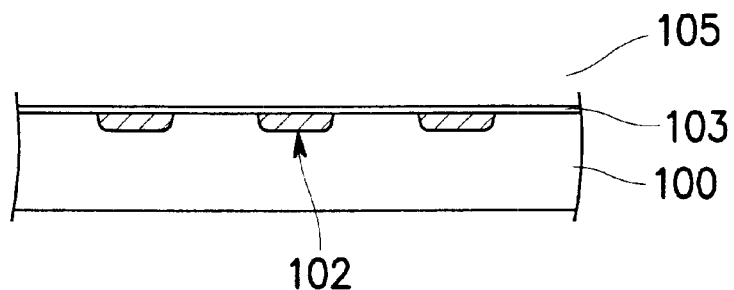

A method for fabricating the NOR-type flat-cell mask ROM of the present invention will be best understood with reference to FIGS. 5 to 10, wherein like reference numerals are used for like and corresponding parts. FIG. 5 is a schematic plan view of the structure of a unit cell of the NOR-type flat-cell mask ROM according to the present invention. FIGS. 6 to 10 are cross sectional views for the unit cell, shown in FIG. 5 taken along the lines A, B, C, D, and E, respectively.

First, N-type wells are formed in predetermined sites of a semiconductor substrate 100 in which P-channel transistors of a peripheral circuit region will be established. P-type wells are then formed on the substrate 100 in which N-channel MOS transistors will be established. Cell transistors of peripheral circuit regions will be formed using a photograph process and an ion implanting process. Subsequently, a field oxide (not shown) is formed in the peripheral circuit regions by an element isolation process that defines active regions and field regions. At this time, the whole memory cell array consists only of the active regions.

Next, predetermined regions of the memory cell array are selectively opened and ion-implanted with N-type impurities forming a burial $N^+$ diffusion layer 102. The burial $N^+$ diffusion layer 102 is provided as a source/drain and a sub bit-line of a cell transistor. Over the resulting structure a gate dielectric 103 is formed followed by vapor-deposition of a conductive layer on the gate dielectric 103. The conductive layer and the dielectric 103 are patterned by a photo-etching process to give gate electrodes 104 of cell transistors and gate electrodes of peripheral circuit transistors, the gate electrodes being provided as the word lines. Concurrently, dummy lines 105 are formed within the block in which n word lines are repeated. In order to reduce resistance, the word lines 104 and the dummy lines 105 are formed preferably into a polycide structure in which an impurity-doped polysilicon layer and a metal silicide layer are stacked.

Thereafter, the peripheral circuit regions are opened by a photograph process and then ion-implanted with N-type impurities to form $N^-$ source/drain regions (not shown) in the substrate surface of the peripheral circuit area. An insulating film is deposited on the resulting structure and subjected to full-surface etch-back to form an insulating spacer 106 at the side wall of the gate electrode 104 and dummy line 106. N-type impurities are then ion-implanted into the peripheral circuit regions to create $N^+$ source/drain regions. If the impurities for $N^-$ and $N^+$ source/drains are implanted into the memory cell array, the junction structure in the memory cell array is converted from $N^+/P^-$ into $N^+/N^-$ or $N^+/N^+$ so that element isolation may not be achieved. Therefore, the $N^-$ and $N^+$ source/drain ion implantation is performed after masking the whole area of the memory cell array. Because the dummy line 105 is placed in the spacer between the select line and the word line 104, the junction breakage voltage between the burial $N^+$ diffusion layer 102 and the $P^-$ substrate 100 does not deteriorate when the sidewall spacer 106 is formed using a full-surface etch back process.

Following $P^+$ source/drain ion implantation into the peripheral circuit regions only, a programming process for selectively shifting threshold voltages is performed by ion-implanting impurities into the channels of the cell transistors. At this time, the dummy line 105 inserted between the select line and the word line keeps the threshold voltage of cell transistor uniform.

After being deposited over the resulting structure, a BPSG film is reflowed to form a planarization layer (not shown) which is then photo-etched, to form metal contacts (not shown). In the present invention, the BPSG film is not thinned over the first and nth word lines adjacent to the select lines because the dummy lines are inserted between the select line and the word line. Therefore, even a subsequent ACP process does not negatively affect program uniformity. A metal wiring process, a protective-film forming process, and a bonding-pad forming process completes the NOR-type flat-cell mask ROM of the invention.

The dummy lines are formed in the spaces between the word lines and the select lines in the nonvolatile memory device of the present invention. The dummy lines significantly relieve the loading effect, resulting in improved cell uniformity.

Having illustrated and described the principles of our invention, it should be readily apparent to those skilled in the art that the invention can be modified in arrangement and detail without departing from such principles. We claim all modifications coming within the spirit and scope of the accompanying claims.

What is claimed is:

1. A nonvolatile memory device, comprising:
   a plurality of burial $N^+$ diffusion layers formed over a semiconductor substrate, each burial $N^+$ diffusion layer being a source/drain of a cell transistor and a sub bit-line of a memory cell array;
   a plurality of word lines formed over the semiconductor substrate with a plurality of gate dielectrics interposed therebetween, the plurality of word lines extending perpendicularly to the plurality of burial $N^+$ diffusion layers;
   a plurality of select lines extending parallel to the word lines for selectively transferring external electrical signals via main bit-lines to the sub bit-lines, the main bit-lines extending parallel to the sub bit-lines; and
   a plurality of dummy lines extending parallel to the plurality of word lines, each dummy line being formed between a selected word line and an adjacent select line.

2. A nonvolatile memory device according to claim 1 wherein the plurality of dummy lines receive a constant voltage when the cell transistor is in an operative state.

3. A nonvolatile memory device according to claim 2 wherein the constant voltage is a ground voltage.

4. A nonvolatile memory device according to claim 1 wherein adjacent dummy lines are separated by a dummy line pitch and adjacent word lines are separated by a word line pitch, the dummy line pitch being substantially equal to the word line pitch.

5. A nonvolatile memory device according to claim 1 wherein the plurality of dummy lines is formed of a same material as the plurality of word lines.

6. A nonvolatile memory device according to claim 1 wherein the selected word line and the adjacent select line are spaced apart between 0.1–1.5 μm.

7. A nonvolatile memory device having a memory cell array including main and sub bit-lines and cell transistors formed on a semiconductor substrate, comprising:

a plurality of burial N+ diffusion layers formed over the substrate;

a plurality of word lines formed over the substrate extending perpendicularly to the plurality of burial N+ diffusion layers;

a plurality of select lines extending parallel to the plurality of word lines, each word line for selecting a cell transistor; and a dummy line extending parallel to the plurality of select lines and formed between a selected word line and an adjacent select line.

8. A nonvolatile memory device according to claim 7 wherein the dummy line receives a constant voltage when the cell transistor is active.

9. A nonvolatile memory device according to claim 7 wherein the dummy line receives a ground voltage when the cell transistor is active.

10. A nonvolatile memory device according to claim 7 wherein adjacent word lines are formed separated by a word line pitch and wherein the dummy line is part of a plurality of dummy lines, adjacent dummy lines being formed at a dummy line pitch equal to the word line pitch.

11. A nonvolatile memory device according to claim 7 wherein the dummy line is formed of the same material as the plurality of word lines.

12. A nonvolatile memory device according to claim 7 wherein the selected word line and the adjacent select line are spaced apart between 0.1–1.5 $\mu$m.

* * * * *

UNITED STATES PATENT AND TRADEMARK OFFICE
CERTIFICATE OF CORRECTION

PATENT NO. : 6,346,733 B1
DATED : February 12, 2002
INVENTOR(S) : Lee et al.

It is certified that error appears in the above-identified patent and that said Letters Patent is hereby corrected as shown below:

Column 2,
Line 66, "N-source/drain" should read -- N- source/drain --.

Column 3,
Lines 60 and 62, "N+" should read -- N+ --.

Column 4,
Line 30, "bitline" should read -- bit-line --.
Line 48, "0.1-1.5 from" should read -- 0.1-1.5 $\mu$m from --.

Column 5,
Line 1, "the conventional mask" should read -- the mask --.

Signed and Sealed this

Fifteenth Day of October, 2002

Attest:

Attesting Officer

JAMES E. ROGAN
*Director of the United States Patent and Trademark Office*